US009251930B1

(12) United States Patent
McNutt

(10) Patent No.: US 9,251,930 B1
(45) Date of Patent: Feb. 2, 2016

(54) SEGMENTED SHIELDS FOR USE IN COMMUNICATION CABLES

(71) Applicant: Superior Essex Communications LP, Atlanta, GA (US)

(72) Inventor: Christopher W. McNutt, Woodstock, GA (US)

(73) Assignee: Essex Group, Inc., Atlanta, GA (US)

( * ) Notice: Subject to any disclaimer, the term of this patent is extended or adjusted under 35 U.S.C. 154(b) by 0 days.

(21) Appl. No.: 13/827,359

(22) Filed: Mar. 14, 2013

Related U.S. Application Data

(60) Provisional application No. 61/754,812, filed on Jan. 21, 2013.

(51) Int. Cl.
*H05K 9/00* (2006.01)
*H01B 11/00* (2006.01)

(52) U.S. Cl.
CPC .................................... *H01B 11/002* (2013.01)

(58) Field of Classification Search
CPC .... H01B 11/08; H01B 11/10; H01B 11/1016; H01B 11/1008
USPC ........... 174/107, 102 R, 108, 109, 102 SP, 36
See application file for complete search history.

(56) References Cited

U.S. PATENT DOCUMENTS 2,796,463 A 6/1957 Mallinkrodt
3,090,825 A 5/1963 Volk
3,135,935 A 6/1964 Eugelbrecht
3,312,774 A 4/1967 Drinko
3,373,475 A 3/1968 Peterson
3,612,744 A 10/1971 Thomas
4,129,841 A 12/1978 Hildebrand et al.
4,327,246 A 4/1982 Kincaid
4,604,497 A 8/1986 Bell et al.
4,638,272 A 1/1987 Ive
4,746,767 A 5/1988 Gruhn
4,881,642 A 11/1989 Adam
4,912,283 A 3/1990 O'Connor
5,006,806 A 4/1991 Rippingale
5,008,489 A 4/1991 Weeks et al.

(Continued)

FOREIGN PATENT DOCUMENTS

GB 2432963 6/2007
JP 200090748 3/2000

(Continued)

OTHER PUBLICATIONS

"Product Catalogue" 2 pages, Enterprise Cabling R&M, May 2006.

(Continued)

*Primary Examiner* — Timothy Thompson
*Assistant Examiner* — Paul McGee, III

(57) ABSTRACT

Cables incorporating discontinuous shields are described. A cable may include at least one twisted pair of individually insulated conductors, and a shield may be formed around the at least one twisted pair. The shield may include a plurality of segments positioned along a longitudinal direction of the cable. Each segment may include electrically conductive material, and each segment electrically isolated from the other segments. Additionally, a respective overlap may be formed between adjacent segments along a shared longitudinal edge. A jacket may be formed around the at least one twisted pair and the shield.

20 Claims, 8 Drawing Sheets

(56) References Cited

U.S. PATENT DOCUMENTS

| | | | |
|---|---|---|---|
| 5,106,175 | A | 4/1992 | Davis et al. |
| 5,114,517 | A | 5/1992 | Rippingale et al. |
| 5,473,336 | A | 12/1995 | Harman et al. |
| 5,952,615 | A | 9/1999 | Prudhon |
| 5,956,445 | A | 9/1999 | Deitz et al. |
| 6,207,901 | B1 * | 3/2001 | Smith et al. ............... H01P 1/30 174/102 R |
| 6,506,976 | B1 | 1/2003 | Neveux |
| 6,677,518 | B2 | 1/2004 | Hirakawa et al. |
| 6,687,437 | B1 | 2/2004 | Starnes et al. |
| 6,723,925 | B2 | 4/2004 | Ohara et al. |
| 6,737,574 | B2 | 5/2004 | Sylvia et al. |
| 6,770,819 | B2 | 8/2004 | Patel |
| 6,831,231 | B2 | 12/2004 | Perelman et al. |
| 6,850,161 | B1 | 2/2005 | Elliot |
| 6,888,070 | B1 | 5/2005 | Prescott |
| 7,173,189 | B1 | 2/2007 | Hazy et al. |
| 7,179,999 | B2 | 2/2007 | Clark et al. |
| 7,332,676 | B2 * | 2/2008 | Sparrowhawk .... H01B 11/1008 174/102 R |
| 7,335,837 | B2 * | 2/2008 | Pfeiler et al. ....... H01B 11/1008 174/113 C |
| 7,834,270 | B2 | 11/2010 | Zhu et al. |
| 7,923,632 | B2 | 4/2011 | Smith et al. |
| 8,119,906 | B1 | 2/2012 | Smith et al. |
| 8,445,787 | B2 | 5/2013 | Nordin et al. |
| 8,558,115 | B2 | 10/2013 | Jenner et al. |
| 2006/0048961 | A1 | 3/2006 | Pfeiler et al. |
| 2007/0037419 | A1 | 2/2007 | Sparrowhawk |
| 2007/0224495 | A1 | 9/2007 | Gibbons et al. |
| 2007/0275583 | A1 | 11/2007 | McNutt et al. |
| 2008/0255435 | A1 | 10/2008 | Al-Ali et al. |
| 2008/0314636 | A1 | 12/2008 | Ogura |
| 2009/0200060 | A1 | 8/2009 | Smith et al. |
| 2009/0223694 | A1 * | 9/2009 | Nordin et al. ...... H01B 11/1008 174/34 |
| 2009/0272571 | A1 | 11/2009 | Gromko |
| 2010/0096179 | A1 | 4/2010 | Sparrowhawk |
| 2010/0101853 | A1 | 4/2010 | McNutt |
| 2010/0224389 | A1 | 9/2010 | Jenner |
| 2011/0147039 | A1 | 6/2011 | Smith et al. |

FOREIGN PATENT DOCUMENTS

| | | |
|---|---|---|
| JP | 2006173044 | 6/2006 |
| WO | WO2006105166 | 5/2006 |

OTHER PUBLICATIONS

"Draka" 12 pgs., Draka Comteq, Cable Solutions, Data cables, Sep. 27, 2006.
"10 Gigabit Ethernet Solutions" 8pgs., R&M Convincing Cabling Solutions.
Wetzikon, "R&M: The Rising Stars in Copper Cabling" 2pgs., Sep. 1, 2005.
"R&M Star Real 10" 2pgs., Mar. 2006.
"Connections 29" 36 pgs., Sep. 2005.
Pfeiler et al., U.S. Pat. No. 7,335,837, issued Feb. 26, 2008.
Non-Final Rejection for U.S. Appl. No. 13/827,257, mailed on Jan. 14, 2015.
Non-Final Rejection for U.S. Appl. No. 13/835,800, mailed on Feb. 19, 2015.
Office Action, mailed on Jul. 16, 2015, for U.S. Appl. No. 14/271,800.
Office Action, mailed Jul. 9, 2015, in the U.S. Appl. No. 13/835,800.
Notice of Allowance and Fee(s) Due in U.S. Appl. No. 14/578,921, mailed on Oct. 9, 2015.

* cited by examiner

SEGMENTED SHIELDS FOR USE IN COMMUNICATION CABLES

CROSS-REFERENCES TO RELATED APPLICATIONS

This application claims priority to U.S. Provisional Application No. 61/754,812, filed Jan. 21, 2013, and entitled "Segmented Shields for Use in Cables," the entire contents of which are incorporated by reference herein.

Additionally, this application is related to U.S. patent application Ser. No. 13/827,257, filed Mar. 14, 2013, and entitled "Segmented Shields for Use in Communication Cables"; U.S. patent application Ser. No. 12/653,804, filed Dec. 19, 2008, and entitled "Communication Cable Having Electrically Isolated Shield Providing Enhanced Return Loss"; U.S. patent application Ser. No. 12/313,914 (Now U.S. Pat. No. 7,923,641), filed Nov. 25, 2008, and entitled "Communication Cable Comprising Electrically Isolated Patches of Shielding Material"; U.S. patent application Ser. No. 11/502,777, filed Aug. 11, 2006, and entitled "Method and Apparatus for Fabricating Noise-Mitigating Cable"; U.S. patent application Ser. No. 12/313,910 (Now U.S. Pat. No. 7,923,632), filed Nov. 25, 2008, and entitled "Communication Cable Comprising Electrically Discontinuous Shield Having Nonmetallic Appearance"; U.S. patent application Ser. No. 12/583,797 (Now U.S. Pat. No. 8,119,906), filed Aug. 26, 2009, and entitled "Communication Cable Shielded With Mechanically Fastened Shielding Elements"; U.S. patent application Ser. No. 12/584,672 (Now U.S. Pat. No. 8,119,907), filed Sep. 10, 2009, and entitled "Communication Cable With Electrically Isolated Shield Comprising Holes"; U.S. patent application Ser. No. 13/039,918, filed Mar. 3, 2011, and entitled "Communication Cable Comprising Electrically Discontinuous Shield Having Nonmetallic Appearance"; and U.S. patent application Ser. No. 13/039,923, filed Mar. 3, 2011, and entitled "Communication Cable Comprising Electrically Discontinuous Shield Having Nonmetallic Appearance". The entire contents of each of these matters are incorporated by reference herein.

TECHNICAL FIELD

Embodiments of the disclosure relate generally to communication cables and, more particularly, to segmented or discontinuous shields for use in communication cables.

BACKGROUND

As the desire for enhanced communication bandwidth escalates, transmission media need to convey information at higher speeds while maintaining signal fidelity and avoiding crosstalk, including alien crosstalk. However, effects such as noise, interference, crosstalk, alien crosstalk, and/or alien equal-level far-end crosstalk ("ELFEXT") can strengthen with increased data rates, thereby degrading signal quality or integrity. For example, when two cables are disposed adjacent one another, data transmission in one cable can induce signal problems in the other cable via crosstalk interference.

One approach to addressing crosstalk between communication cables is to circumferentially encase each cable in a continuous shield, such as a flexible metallic tube or a foil that coaxially surrounds the cable's conductors. However, shielding based on conventional technology can be expensive to manufacture and/or cumbersome to install in the field. In particular, complications can arise when a cable is encased by a shield that is electrically continuous between the two ends of the cable. The continuous shield can inadvertently carry voltage along the cable, for example from one terminal device at one end of the cable towards another terminal device at the other end of the cable. If a person contacts the shielding, the person may receive a shock if the shielding is not properly grounded. Accordingly, continuous cable shields are typically required to be grounded at both ends of the cable to reduce shock hazards and loop currents that can interfere with transmitted signals. Such a continuous shield can also set up standing waves of electromagnetic energy based on signals received from nearby energy sources. In this scenario, the shield's standing wave can radiate electromagnetic energy, somewhat like an antenna, that may interfere with wireless communication devices or other sensitive equipment operating nearby.

In order to address the limitations of continuous shields, segmented or discontinuous shields have been incorporated into certain cables. These segmented shields typically include metallic patches formed on a polymeric film with gaps or spaces formed between adjacent patches to maintain electrical discontinuity. Thus, the metallic patches function as an electromagnetic shield; however, it is not necessary to ground the shields during cable installation. Current segmented shield designs are typically manufactured by wrapping a shield tape either longitudinally or helically around a cable core. However, the spaces or gaps between the metallic patches may lead to electrical perturbations and decreased performance in the cable. Accordingly, there is an opportunity for improved segmented shields, methods or techniques for forming segmented shields, and/or cables incorporating segmented shields.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1:
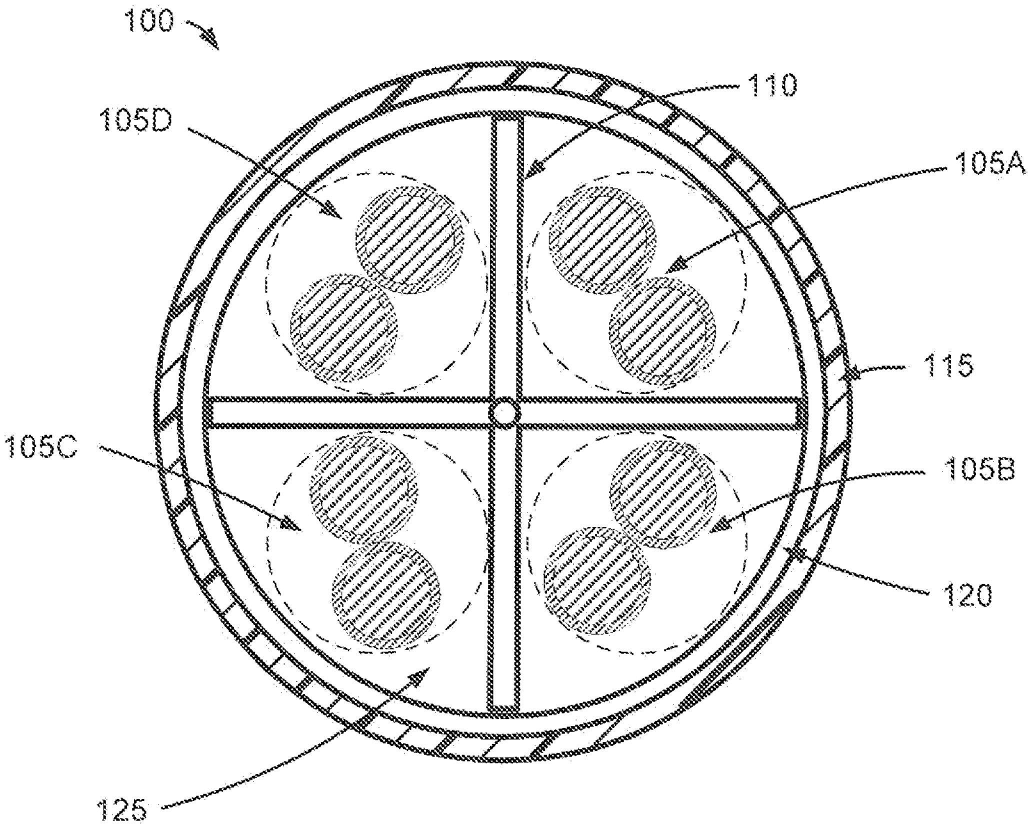
FIG. 1 is a cross-sectional view of an example cable including at least one shield, according to an illustrative embodiment of the disclosure.

Various embodiments of the present disclosure are directed to shields for use in cables, such as twisted pair communication cables and/or other cables that incorporate electrical conductors. In accordance with various example embodiments, a cable may include one or more transmission media within a core of the cable, such as one or more twisted pairs of conductors. In certain embodiments, one or more transmission media may be individually wrapped or longitudinally enclosed in one or more suitable shields or shield layers. In other embodiments, one or more groups of transmission media (e.g., twisted pairs, etc.) may be wrapped or longitudinally enclosed in a suitable shield. For example, an external shield may circumscribe a plurality of twisted pairs (and/or other cable components). As another example, one or more subgroups of twisted pairs (and/or other cable components) may be shielded. In other embodiments, any combination of shielding arrangements may be utilized. According to an aspect of the disclosure, at least one shield or shield layer may be formed to include a plurality of longitudinally overlapping segments. As desired, each segment may include electrically conductive material, and the electrically conductive material of any given may be electrically isolated from that of other segments.

In one example embodiment, a shield may be formed from a plurality of longitudinally extending segments. Each segment may be wrapped around one or more transmission media of the cable. For example, each segment may be circumferentially wrapped around one or more twisted pairs (and/or other cable components) to be shielded. According to an aspect of the disclosure, the segments may be arranged adjacent to one another along a longitudinal length of a cable, and an overlap may be formed between each adjacent segment. For example, a first shield segment formed around one or more twisted pairs may have a first longitudinal edge and a second longitudinal edge opposite the first edge. Similarly, a second shield segment formed around the one or more twisted pairs may have a first longitudinal edge and a second longitudinal edge opposite the first edge. The first longitudinal edge of the second shield segment may overlap the second longitudinal edge of the first shield segment. In a similar manner, a third shield segment may overlap the second shield segment, and so on. Any desired overlap may be utilized as desired in various embodiments, such as an overlap of approximately one quarter inch or greater, an overlap of approximately one half inch or greater, an overlap of approximately one inch or greater, or an overlap falling within a desired range.

In certain embodiments, individual shield segments may be separately wrapped around one or more twisted pairs (and/or other cable components) during cable assembly such that adjacent shield segments overlap one another. For example, a first shield segment may be wrapped around one or more twisted pairs, a second shield segment may then be wrapped around the one or more twisted pairs so as to overlap an edge of the first shield segment along a longitudinal direction of a cable, a third shield segment may then be wrapped around the one or more twisted pairs so as to overlap an opposite edge of the second shield segment, and so on. In other embodiments, a shield may be formed from a plurality of overlapping segments, and the formed shield may be wrapped around one or more twisted pairs or other transmission media. In other words, a preformed shield may be incorporated into a cable during cable assembly.

As a result of utilizing overlapping longitudinal segments, the electrical properties of a shield may be improved relative to conventional discontinuous shields. In conventional discontinuous shields, the longitudinal spaces or gaps between adjacent patches of electrically conductive material may lead to electrical perturbations and decreased performance in the cable. These spaces or gaps may be eliminated by certain embodiments of the disclosure, thereby improving electrical performance in the cable. In certain embodiments, a shield having discontinuous electrically conductive shielding elements may be formed, and the shield may provide shielding along the entire length of a cable. In other words, exposed gaps perpendicular to the cable's longitudinal axis (e.g., gaps between electrically conductive patches) may be eliminated, thereby improving electrical performance. For example, overall alien cross-talk performance may be improved and/or electrical perturbations due to gaps may be reduced or minimized.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

With reference to FIG. 1, a cross-section of an example cable 100 that may be utilized in various embodiments is illustrated. The cable 100 is illustrated as a twisted pair communications cable; however, other types of cables may be utilized, such as other cables that include electrical conductors (e.g., twisted pairs, etc.) and/or composite cables that include a combination of electrical conductors (e.g., twisted pairs, etc.) and other transmission media (e.g., optical fibers, etc.). The cable 100 may include any number of transmission media, such as one or more twisted pairs, one or more optical fibers, one or more coaxial cables, and/or one or more power conductors. As shown in FIG. 1, the cable 100 may include four twisted pairs 105A, 105B, 105C, 105D; however, any other number of pairs may be utilized. As desired, the twisted pairs may be twisted or bundled together and/or suitable bindings may be wrapped around the twisted pairs. In yet other embodiments, multiple grouping of twisted pairs may be incorporated into a cable. As desired, each grouping may be twisted, bundled, and/or bound together. Further, in certain embodiments, the multiple groupings may be twisted, bundled, or bound together. Additionally, embodiments of the disclosure may be utilized in association with horizontal cables, vertical cables, flexible cables, equipment cords, cross-connect cords, plenum cables, riser cables, or any other appropriate cables.

In certain embodiments, the cable 100 may also include a separator 110 (also referred to as a separation filler, a filler, an interior support, or a spline) configured to orient and or position one or more of the twisted pairs 105A-D, as well as an outer jacket 115. Each twisted pair (referred to generally as twisted pair 105 or collectively as twisted pairs 105) may include two electrical conductors, each covered with suitable insulation. As desired, each of the twisted pairs may have the same twist lay length or alternatively, at least two of the twisted pairs may include a different twist lay length. The different twist lay lengths may function to reduce crosstalk between the twisted pairs. Additionally, in certain embodiments, each of the twisted pairs may be twisted in the same direction (e.g., clockwise, counter clockwise). In other embodiments, at least two of the twisted pairs may be twisted in opposite directions. The insulation may include any suitable dielectric materials (e.g., a polymeric material, polyvinyl chloride ("PVC"), polyurethane, one or more polymers, a fluoropolymer, polyethylene, polypropylene, neoprene, cholorosulphonated polyethylene, fluorinated ethylene propylene ("FEP"), flame retardant PVC, low temperature oil resistant PVC, polyolefin, flame retardant polyurethane, flexible PVC, etc.) and/or combination of materials. In certain embodiments, the insulation may be foamed. As desired, different foaming levels may be utilized in accordance with twist lay length to result in insulated twisted pairs having an equivalent or approximately equivalent overall diameter. In certain embodiments, the insulation may additionally include other materials, such as a flame retardant material and/or a smoke suppressant material.

The jacket 115 may enclose the internal components of the cable 100, seal the cable 100 from the environment, and provide strength and structural support. The jacket may be formed from a wide variety of suitable materials, such as a polymeric material, polyvinyl chloride ("PVC"), polyurethane, one or more polymers, a fluoropolymer, polyethylene, polypropylene, neoprene, cholorosulphonated polyethylene, fluorinated ethylene propylene ("FEP"), flame retardant PVC, low temperature oil resistant PVC, polyolefin, flame retardant polyurethane, flexible PVC, low smoke zero halogen ("LSZH") material, or some other appropriate material known in the art, or a combination of suitable materials. In certain embodiments, the jacket 115 can include flame retardant and/or smoke suppressant materials. Additionally, the jacket 115 may include a wide variety of suitable shapes and/or dimensions. For example, the jacket 115 may be formed to result in a round cable or a cable having an approximately circular cross-section; however, the jacket 115 and internal components may be formed to result in other desired shapes, such as an elliptical, oval, or rectangular shape. The jacket 115 may also have a wide variety of dimensions, such as any suitable or desirable outer diameter and/or any suitable or desirable wall thickness. In various embodiments, the jacket 115 can be characterized as an outer jacket, an outer sheath, a casing, a circumferential cover, or a shell.

The jacket 115 can be single layer or have multiple layers. In certain embodiments, one or more tubes, tapes, or other layers can be disposed between the jacket 115 and the twisted pairs 105. In certain embodiments, a shield layer 120 (e.g., a shield tape, etc.) may be disposed between the jacket 115 and the twisted pairs 105 or, alternatively, a shield layer may be incorporated into the jacket 115 or placed on the outside of the jacket. In other embodiments, one or more individual twisted pairs 105A-D or desired groupings of twisted pairs may be shielded. In yet other embodiments, any number of cable components (e.g., optical fibers, twisted pairs, etc.) may be situated within one or more buffer tubes, such as polypropylene ("PP") buffer tubes, polyethylene ("PE") buffer tubes, or polybutylene terephthalate ("PBT") buffer tubes, and one or more shield layers may be formed on, adhered to, incorporated into, or embedded within the buffer tubes. As explained in greater detail below, a shield layer (or similarly a tube) may incorporate electrically conductive material in order to provide electrical shielding for one or more cable components. Further, in certain embodiments, the cable 100 may include a separate, armor layer (e.g., a corrugated armor, etc.) for providing mechanical protection.

Each twisted pair 105A-D can carry data or some other form of information, for example in a range of about one to ten Giga bits per second ("Gbps") or another appropriate frequency, whether faster or slower. In certain embodiments, each twisted pair 105A-D supports data transmission of about two and one-half Gbps (e.g. nominally two and one-half Gbps), with the cable 100 supporting about ten Gbps (e.g. nominally ten Gbps). In certain embodiments, each twisted pair 105A-D supports data transmission of about ten Gbps (e.g. nominally ten Gbps), with the cable 100 supporting about forty Gbps (e.g. nominally forty Gbps).

As set forth above, each twisted pair 105A-D may have a different twist rate. In certain embodiments, the differences between twist rates of twisted pairs 105 that are circumferentially adjacent one another (for example the twisted pair 105A and the twisted pair 105B) may be greater than the differences between twist rates of twisted pairs 105 that are diagonal from one another (for example the twisted pair 105A and the twisted pair 105C). As a result of having similar twist rates, the twisted pairs 105 that are diagonally disposed can be more susceptible to crosstalk issues than the twisted pairs 105 that are circumferentially adjacent; however, the distance between the diagonally disposed pairs may limit the crosstalk. Thus, the different twist lengths and arrangements of the pairs can help reduce crosstalk among the twisted pairs 105.

An opening enclosed by the jacket 115 may be referred to as a cable core 125, and the twisted pairs 105 may be disposed within the cable core. In certain embodiments, the cable core 125 can be filled with a gas such as air (as illustrated) or alternatively a gelatinous, solid, powder, moisture absorbing material, water-swellable substance, dry filling compound, or foam material, for example in interstitial spaces between the twisted pairs 105. Other elements can be added to the cable core 125, for example one or more optical fibers, additional electrical conductors, additional twisted pairs, and/or strength members, depending upon application goals.

As shown in FIG. 1, at least one shield layer 120 may be provided for the cable 100, and the shield layer 120 may be wrapped around the collective group of twisted pairs 105. A shield layer 120 that encompasses all of the twisted pairs 105 may be referred to as an external shield 120. In certain embodiments, the shield 120 may be positioned between the twisted pairs 105 and the outer jacket 115. In other embodiments, the shield 120 may be embedded into the outer jacket 115, incorporated into the outer jacket 115, or even positioned outside of the outer jacket 115. In yet other embodiments, individual pairs or desired groupings of twisted pairs may be shielded. For example, each twisted pair 105A-D may be individually shielded. As another example, shield layers may be provided for any desired groupings of twisted pairs. As desired, multiple shield layers may be provided, for example, individual shields and an overall shield.

According to an aspect of the disclosure, at least one shield, such as shield 120, may be formed to include overlapping segments. The shield 120 may be formed to include a plurality of electrically conductive patches arranged in a discontinuous manner. In other words, the electrically conductive patches may be electrically isolated from one another. However, in certain embodiments and in contrast to conventional shields, the shield 120 may not include spaces or gaps between patches along a longitudinal direction of the cable. The shield 120 may include a plurality of overlapping segments or sections along a longitudinal length of the cable, and each segment may include at least one electrically conductive patch or portion. The combination of the segments may form a discontinuous shield; however, the overlapping nature of the segments may eliminate gaps between certain patches along a longitudinal direction. Thus, the discontinuous shield 120 may exhibit improved electrical performance relative to conventional discontinuous shields.

Each shield segment may include a carrier layer (e.g., a dielectric layer, etc.) with one or more electrically conductive patches formed thereon. Adjacent shield segments may be positioned in the cable 100 so that an end of a first segment (e.g., a second or distal end along the longitudinal direction or length of the cable 100) is overlapped by the first end of a second segment. In other words, the segments may be incorporated into the cable 100 to include overlapping edges along a length of the cable 100. Further, the carrier layers of the shield segments may provide isolation between the electrically conductive patches formed on each segment. For example, at an overlapping region, a first segment may include an electrically conductive patch formed on a dielectric material. A second segment may have a similar construction. When incorporated into the cable 100, the dielectric material of the second segment may be in contact with the electrically conductive patch of the first segment at the overlapping region. Thus, electrical isolation exists between the electrically conductive patch of the first segment and the electrically conductive patch of the second segment.

Additionally, in certain embodiments, at least one electrically conductive patch included in a shield, such as shield 120, may be electrically shorted or continuous along a circumferential direction. In other words, when the shield (or a plurality of shield segments) is wrapped around one or more twisted pairs 105A-D, a patch may contact itself, for example, at the edges of the shield. As a result, the patch may be electrically shorted to itself, thereby creating a continuous patch in a circumferential direction or along a periphery of the enclosed twisted pairs 105A-D. When the shield is formed to include a plurality of patches that are discontinuous in a longitudinal direction and one or more patches are electrically shorted in a circumferential direction, electrical perturbations caused by the shield may be reduced relative to conventional cables. Therefore, the cable 100 may exhibit improved electrical performance, such as reduced return loss and/or reduced cross-talk loss.

Example embodiments of an outer shield 120 will now be described in greater detail; however, a wide variety of other types of shields (e.g., individual shields, shields for subset of transmission media, etc.) may be formed utilizing similar techniques as those described below). The shield 120 may be formed from a wide variety of suitable materials as desired in various embodiments. The shield 120 may include a plurality of overlapping segments or sections, and each segment may include electrically conductive material. In certain embodiments, electrically conductive material (e.g., one or more patches of electrically conductive material) may be formed on a carrier or substrate layer (e.g., a dielectric layer, a tape, etc.), and the carrier layer may be cut or otherwise divided in order to form segments that will be utilized in the shield 120. In other embodiments, respective electrically conductive material may be formed on a plurality of carrier or substrate layers (e.g., precut sections of a dielectric material, etc.) that will be incorporated into the shield 120. In other embodiments, one or more patches may be sandwiched between two carrier layers (e.g., two dielectric layers).

A wide variety of other suitable techniques for forming shield segments to be overlapped will be appreciated. Additionally, when incorporated into the cable 100, any number of suitable techniques may be utilized as desired to hold the shield segments in place. For example, an adhesive (e.g., a contact adhesive, a pressure sensitive adhesive, a hot melt adhesive) may be applied to a segment in order to adhere the segment to one or more other segments, the transmission media, an inner surface of an outside cable jacket, and/or to any other desired components of a cable (e.g., an armor layer, a water-blocking layer, a tube, etc.). In other embodiments, shield segments may be adhered or otherwise combined together prior to incorporation of the shield 120 into the cable 100.

A wide variety of shield segment overlap distances may be utilized in various embodiments of the disclosure. For example, a first shield segment may overlap a second shield segment along a longitudinal direction of the cable 100 by approximately 0.25 inches (0.00635 meters), 0.5 inches (0.0127 meters), 1 inch (0.0254 meters), 1.5 inches (0.0381 meters), 2 inches (0.0508 meters), more than approximately 0.25 inches, more than approximately 0.5 inches, more than approximately 1 inch, more than approximately 2 inches, a distance included in any suitable range formed using any of the values above, or any other desirable distance. In certain embodiments, a first shield segment may overlap a second shield segment by approximately 8 inches or less. In other embodiments, a first shield segment may overlap a second shield segment by approximately 1.5 inches or less. Additionally, in certain embodiments, the overlap distances formed between various pairs of shield segments may be approximately equal. In other embodiments, various pairs of shield segments may have different overlap distances.

In certain embodiments, a segment or section of the shield 120 may include a single patch or section of electrically conductive material. In other embodiments, a segment or section of the shield 120 may include a plurality of electrically conductive patches, and gaps or spaces may be present between adjacent patches. For example, a plurality of discontinuous patches may be formed on one side of a carrier layer with gaps between adjacent patches. As desired, patches may be formed on the other side of the carrier layer to cover the gaps or spaces. A wide variety of different patch patterns may be formed as desired in various embodiments, and a patch pattern may include a period or definite step. In other embodiments, patches may be randomly formed or situated on a carrier layer. As desired, any number of carrier layers and electrically conductive layers may be utilized within a segment of the shield 120. A few example configurations for forming shields are described in greater detail below with reference to FIGS. 6A-B and FIGS. 7A-D.

As desired, a wide variety of suitable techniques and/or processes may be utilized to form a shield 120 (or a shield segment). As one example, a base material or dielectric material may be extruded, poltruded, or otherwise formed. Electrically conductive material may then be applied to the base material. In other embodiments, electrically conductive material may be injected into the base material. In other embodiments, dielectric material may be formed or extruded over electrically conductive material in order to form a shield 120. Indeed, a wide variety of suitable techniques may be utilized to incorporate electrically conductive material into a shield 120.

In certain embodiments, the base layer may have a substantially uniform composition and/or may be made of a wide range of materials. Additionally, the base layer may be fabricated in any number of manufacturing passes, such as a single manufacturing pass. Further, the base layer may be foamed, may be a composite, and/or may include one or more strength members, fibers, threads, or yarns. As desired, flame retardant material, smoke suppressants, and/or other desired substances may be blended or incorporated into the base layer.

In certain embodiments, the shield 120 (or individual shield segments) may be formed as a tape that includes both a dielectric layer (e.g., plastic, polyester, polyethylene, polypropylene, fluorinated ethylene propylene, polytetrafluoroethylene, polyimide, or some other polymer or dielectric material that does not ordinarily conduct electricity etc.) and an electrically conductive layer (e.g., copper, aluminum, silver, an alloy, etc.) formed on one or both sides of the dielectric layer. In certain embodiments, a separate dielectric layer and electrically conductive layer may be bonded, adhered, or otherwise joined (e.g., glued, etc.) together to form the shield 120. In other embodiments, electrically conductive material may be formed on a dielectric layer via any number of suitable techniques, such as the application of metallic ink or paint, liquid metal deposition, vapor deposition, welding, heat fusion, adherence of patches to the dielectric, or etching of patches from a metallic sheet. In certain embodiments, the conductive patches can be over-coated with an electrically insulating film, such as a polyester coating. Additionally, in certain embodiments, an electrically conductive layer may be sandwiched between two dielectric layers. In other embodiments, at least two electrically conductive layers may be combined with any number of suitable dielectric layers to form the shield 120. For example, a four layer construction may include respective electrically conductive layers formed on either side of a first dielectric layer. A second dielectric layer may then be formed on one of the electrically conductive layers to provide insulation between the electrically conductive layer and the twisted pairs 105. Indeed, any number of suitable layers of material may be utilized to form a tape which may be used as the shield 120.

According to an aspect of the disclosure, one or more of the electrically conductive patches included in the shield 120 may be shorted in a circumferential direction. In other words, the patch may contact itself at the edges of shield 120 (or at or near at least one edge of the shield 120) once the shield 120 is wrapped around one or more twisted pairs 105. A wide variety of suitable methods or techniques may be utilized to electrically short patches in a circumferential direction. In certain embodiments, a shield 120 including a dielectric material with electrically conductive patches formed thereon may be folded over itself along one edge or along a portion of one edge (illustrated and described in greater detail below with reference to FIG. 3A). Accordingly, when the shield 120 is wrapped around one or more transmission media and brought into contact with itself within an overlapping region, the electrically conductive patch material at one edge of the shield 120 will be brought into contact with the electrically conductive patch material at the opposing edge (or at another point) of the shield 120.

In other embodiments, a dielectric or substrate material may be removed from one edge (or a portion of one edge) of the shield 120. Alternatively, an electrically conductive patch may be formed or attached to a dielectric material so as to overhang or extend beyond one edge (or a portion of one edge) of the dielectric material (as illustrated and described in greater detail below with reference to FIG. 3B). Accordingly, when the shield 120 is wrapped around one or more transmission media and brought into contact with itself, the two edges of a patch will be brought into contact with one another, thereby creating an electrically shorted patch. In yet other embodiments, a patch may be folded over one edge (or a portion of one edge) of a dielectric substrate (as illustrated and described in greater detail below with reference to FIG. 3D). In other words, at one edge of the shield 120, a patch may be present on both sides of a dielectric. Accordingly, when the shield 120 is wrapped around one or more transmission media and brought into contact with itself, the patch will be electrically shorted. In yet other embodiments, one or more gaps may be formed in a dielectric or substrate at or near one edge of the shield 120. When wrapped around one or more transmission media, one edge of a patch may be permitted to contact another edge of the patch via the one or more gaps. Similarly, in certain embodiments, one or more vias (e.g., metallic or electrically conductive vias, etc.) may be provided in the dielectric to permit two portions of a patch to be brought into contact.

A wide variety of suitable electrically conductive materials or combination of materials may be utilized to form electrically conductive patches incorporated into a shield 120 including, but not limited to, metallic material (e.g., silver, copper, nickel, steel, iron, annealed copper, gold, aluminum, etc.), metallic alloys, conductive composite materials, etc. Indeed, suitable electrically conductive materials may include any material having an electrical resistivity of less than approximately $1\times10^{-7}$ ohm meters at approximately 20° C. In certain embodiments, an electrically conductive material may have an electrical resistivity of less than approximately $3\times10^{-8}$ ohm meters at approximately 20° C.

Additionally, individual patches may be separated from one another so that each patch is electrically isolated from the other patches. That is, the respective physical separations between the patches may impede the flow of electricity between adjacent patches. The physical separation of certain patches may result from the overlapping of shield segments. In certain embodiments, such as embodiments in which a plurality of patches are formed on a single shield segment, the physical separation of other patches may be formed by gaps or spaces, such as gaps of dielectric material. The respective physical separations between the patches may impede the flow of electricity between adjacent patches. Additionally, in certain embodiments, one or more of the electrically conductive patches may span fully across a shield 120 in the longitudinal direction, which may permit the circumferential shorting of the patches.

The components of the shield segments may include a wide variety of suitable dimensions, for example, any suitable lengths in the longitudinal direction and/or any suitable thicknesses. A dielectric portion included in a shield segment may have any desired thickness, such as a thickness of about 1 to about 5 mils (thousandths of an inch) or about 25 to about 125 microns. Additionally, each electrically conductive patch may include a coating of metal (or other material) having any desired thickness, such as a thickness of about 0.5 mils (about 13 microns) or greater. In many applications, signal performance benefits from a thickness that is greater than about 2 mils, for example in a range of about 2.0 to about 2.5 mils, about 2.0 to about 2.25 mils, about 2.25 to about 2.5 mils, about 2.5 to about 3.0 mils, or about 2.0 to about 3.0 mils. Indeed, with a thickness of less than about 1.5 mils, negative insertion loss characteristics may be present on the cable 100.

In certain embodiments, an electrically conductive patch may cover substantially an entire area of a shield segment (e.g., substantially the entire surface on one side of a carrier layer, etc.). In other embodiments, a plurality of electrically conductive patches may be formed on a shield segment. For example, a plurality of patches may be formed on a first side of a dielectric material with gaps or spaces between adjacent patches. As desired, additional patches may be formed on the opposite side of the dielectric material to cover the gaps or spaces. A wide variety of segment and/or patch lengths (e.g., lengths along a longitudinal direction of the cable 100) may be utilized. As desired, the dimensions of the segments and/or electrically conductive patches can be selected to provide electromagnetic shielding over a specific band of electromagnetic frequencies or above or below a designated frequency threshold. In certain embodiments, each segment and/or patch may have a length of about one meter to about one hundred meters, although lengths of less than one meter (e.g., lengths of about 1.5 to about 2 inches, etc.) may be utilized. For example, the segments and/or patches may have a length in a range of about one to ten meters. In various embodiments, the segments and/or patches can have a length of about 0.5, 0.75, 1.0, 1.5, 2.0, 2.5, 3.0, 3.5, 4.0, 4.5, or 5.0 meters or in a range between any two of these values;

In one example embodiment, segments and/or patches of electrically conductive material may be between approximately two and five meters in length, although other suitable lengths may be utilized such as lengths up to 100 meters or lengths smaller than two meters. In the event that the patches are approximately two meters in length or greater, a return loss spike for the cable may be formed within the operating frequency of the cable. However, the amplitude of the return loss spike may satisfy electrical performance requirements for the cable (i.e., fall within acceptable limits), thereby permitting higher signal frequencies to be supported by the cable. In the event that smaller patches are utilized, a return loss spike may be shifted outside of the operating range of the cable.

In the event that a plurality of patches is formed on a shield segment, a wide variety of suitable gap distances or isolation gaps may be provided between adjacent patches. For example, the isolation spaces can have a length of about 0.5, 1.0, 1.5, 2.0, 2.5, 3.0, 3.5, or 4 millimeters or in a range between any two of these values. In one example embodiment, each patch formed on a segment may be at least two meters in length, and a relatively small isolation gap (e.g., 4 millimeters or less, about 1/16 of an inch, etc.) may be formed between adjacent patches. Additionally, the patches may be formed as first patches (e.g., first patches on a first side of a dielectric material), and second patches may be formed on an opposite side of the dielectric material (or on another dielectric material). For example, second patches may be formed to correspond with the gaps or isolation spaces between the first patches. As desired, the shield segments and/or electrically conductive patches may have a wide variety of different shapes and/or orientations. For example, the segments and/or patches may have a rectangular, trapezoidal, or parallelogram shape. A few example shapes for shield segments and/or patches are described in greater detail below with reference to FIGS. 7A-7D.

In certain embodiments, the shield segments and/or electrically conductive patches may be formed to be approximately perpendicular (e.g., square or rectangular segments and/or patches) to the longitudinal axis of the enclosed one or more pairs 105. In other embodiments, the shield segments and/or patches may have a spiral direction that is opposite the twist direction of the enclosed one or more pairs 105. That is, if the twisted pair(s) 105 are twisted in a clockwise direction, then the shield segments and/or patches may spiral in a counterclockwise direction. If the twisted pair(s) 105 are twisted in a counterclockwise direction, then the conductive patches may spiral in a clockwise direction. Thus, twisted pair lay opposes the direction of the shield segment and/or patch spiral. The opposite directions may provide an enhanced level of shielding performance. In other embodiments, the shield segments and/or patches may have a spiral direction that is the same as the twist direction of the enclosed one or more pairs 105. In yet other embodiments, the patches may not exhibit a spiral direction.

With continued reference to FIG. 1, in certain embodiments, a separator 110 may also be disposed within the cable core 125. The separator 110 may function to maintain a desired orientation of the twisted pairs 105 to provide beneficial signal performance. In certain embodiments, the separator 110 may include one or more electrically conductive elements or shielding elements, such as a metallic tape and/or any number of electrically conductive patches. In this regard, the separator 110 may function to reduce or limit crosstalk and/or electrical interference between two or more of the twisted pairs 105. In certain embodiments, the separator 110 may include a plurality of discontinuous patches, such as patches similar to those described above with reference to the shield 120. In other embodiments, the separator 110 may include a relatively continuous shield. In other embodiments, the separator 110 may not include any electrically conductive portions or other shielding features.

As desired in various embodiments, the separator 110 may be formed from a wide variety of suitable materials. For example, the separator 110 can include paper, metals, alloys, various plastics, polyolefins (e.g., polyethylene, polypropylene, etc.), fluoropolymers (e.g., fluorinated ethylene propylene, etc.), etc. polyurethane, flame retardant polyurethane, PVC, polyethylene, FEP, ethylene chlorotrifluoroethlyene ("ECTFE"), one or more fluoropolymers, neoprene, cholorosulphonated polyethylene, flame retardant PVC, low temperature oil resistant PVC, polyolefin, flexible PVC, low smoke zero halogen ("LSZH") material, various copolymers, or any other suitable materials or combination of materials. As desired, the separator 110 may be filled, unfilled, foamed, un-foamed, homogeneous, or inhomogeneous and may or may not include additives. For example, the separator 110 may include flame retardant and/or smoke suppressant materials. As desired, a wide variety of suitable techniques and/or processes may be utilized to form the separator 110. For example, a base material or dielectric material may be extruded, poltruded, or otherwise formed. In certain embodiments, electrically conductive material may be applied to the base material, inserted into the base material, or embedded in the base material. In other embodiments, dielectric material may be formed around electrically conductive material. As desired, the base layer may have a substantially uniform composition, may be made of a wide range of materials, and/or may be fabricated in a single manufacturing pass. Further, the base layer may be foamed, may be a composite, and may include one or more strength members, fibers, threads, or yarns. Additionally, as desired, the base layer may be hollow to provide a cavity that may be filled with air or some other gas, gel, fluid, moisture absorbent, water-swellable substance, dry filling compound, powder, an optical fiber, a metallic conductor (e.g., a drain wire, etc.), shielding, or some other appropriate material or element.

In certain embodiments, the separator 110 may be formed as a tape that includes a dielectric layer (e.g., plastic, polyester, polyethylene, polypropylene, fluorinated ethylene propylene, polytetrafluoroethylene, polyimide, or some other polymer or dielectric material that does not ordinarily conduct electricity etc.) and, if desired, an electrically conductive layer (e.g., copper, aluminum, an alloy, etc.). A tape separator may be formed in a similar manner as the tape shield layer described above.

As desired in various embodiments, the separator 110 may be formed in accordance with a wide variety of suitable dimensions, shapes, or designs. For example, a rod-shaped separator, a flat tape separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized. In certain embodiments, a dielectric material may be cast or molded into a desired shape. In other embodiments, a tape may be formed into a desired shape utilizing a wide variety of folding and/or shaping techniques. For example, a relatively flat tape separator may be formed into an X-shape or cross-shape as a result of being passed through one or more dies. In certain embodiments, a relatively flat tape separator may be rolled into a relatively circular shape along the longitudinal direction by a die (or prior to being passed into the die) that forms the separator into a desired shape.

As set forth above, the separator 110 may include any number of electrically conductive patches in certain embodiments. For example, a single electrically conductive patch may form a relatively continuous shield along a longitudinal length of the separator. Alternatively, a plurality of electrically conductive patches may be provided that are electrically isolated from one another to provide one or more shields. The patches can be formed on or adhered to a base or dielectric portion of the separator 110. Any number of desired patch dimensions, shapes, thicknesses, and/or other characteristics may be utilized. Additionally, any desired patch separation or gaps may be utilized. Several example patch dimensions, separation distances, and/or other configurations are discussed above with reference to the shield 120, and it will be appreciated that these configurations are equally applicable to the separator 110.

Additionally, in certain embodiments, the separator 110 may be continuous along a length of the cable 100. In other embodiments, the separator 110 may be non-continuous or discontinuous along a length of the cable 100. In other words, the separator 110 may be non-continuous, separated, or segmented in a longitudinal direction, and the separator 110 may include a plurality of discrete separator segments or portions. As a result, the flexibility of the cable 100 may be enhanced relative to that of a cable with a continuous separator. Additionally, an amount of material utilized to form the separator 110, and therefore the cable 100, may be reduced relative to that of a cable with a continuous separator. As a result, in certain embodiments, the cost of forming the cable 100 may be reduced.

In the event that a discontinuous separator 110 is utilized, a respective gap or space may be present in the longitudinal direction of the cable 100 between two consecutive portions of the separator 110. In certain embodiments, the sizes of the gaps between consecutive portions may be approximately equal along a length of the cable. In other embodiments, the sizes of the gaps may be varied in accordance with a pattern or in a random manner. Additionally, a wide variety of gap sizes may be utilized as desired in various embodiments. In certain embodiments, the gaps may be small enough to prevent the twisted pairs 105 from contacting each other in the interstitial spaces between portions of the separator 110. In other embodiments, a discontinuous separator may include portions that overlap one another along a longitudinal length of the cable 100. In other embodiments, adjacent portions or segments of the separator 110 may contact one another in a longitudinal direction such that gaps are not formed. In yet other embodiments, certain segments of the separator 110 may contact one another while gaps are formed between other segments.

Additionally, the various portions or segments of the separator 110 may include a wide variety of different lengths and/or sizes. For example, a portion of the separator 110 may be approximately six inches, one foot, two feet, or any other suitable length. As another example, a portion of the separator 110 may be approximately half a meter, one meter, two meters, or three meters. In certain embodiments, portions of the separator 110 may be approximately three meters or less. In certain embodiments, portions having a common length may be incorporated into the cable 100. In other embodiments, portions of the separator 110 may have varying lengths. These varying lengths may follow an established pattern or, alternatively, may be incorporated into the cable at random.

In certain embodiments, a separator 110 may make use of alternating materials in adjacent portions (whether or not a gap is formed between adjacent portions). For example, a first portion or segment of the separator 110 may be formed from a first set of one or more materials, and a second portion or segment of the separator 110 may be formed from a second set of one or more materials. Similar to a discontinuous separator, a multi-component separator may enhance the flexibility of a cable 100. Additionally, in certain embodiments, construction costs may be reduced. For example, in the event that relatively expensive flame retardant material is only incorporated into certain segments, material costs may be reduced while still providing adequate flame retardant qualities.

As desired in certain embodiments, the separator 110 may additionally include an adhesive that functions to bond the twisted pairs 105 to the separator 110. For example, a pressure sensitive adhesive (e.g., glue, etc.) or a hot melt adhesive (e.g., a thermoplastic, an elastomer, an elastomeric material, a thermoplastic elastomer, synthetic rubber, latex rubber, silicone rubber, silicone polyurethane, silicone, acrylic rubber, etc.) may be applied to the separator 110 during construction of the cable 100 (e.g., prior to forming the outer jacket 115, etc.), and the twisted pairs 105 may be brought into contact the adhesive. In certain embodiments, the adhesive may be applied in-line as the cable 100 is constructed. For example, a hot melt adhesive may be applied in liquid form to the separator 110, and the twisted pairs 105 may be brought into contact with the separator 110 before the adhesive cools.

The adhesive may include a higher coefficient of friction than other components of the separator 110, such as a coefficient of friction that is two, three, four, five, ten, or twenty times greater than other components of the separator 110. As a result, the adhesive may hold the twisted pairs 105 in place during construction of the cable 100 (e.g., prior to formation of the outer jacket 115), during storage, shipment, and installation of the cable 100 (e.g., as the cable 100 is drawn through a duct, etc.), and/or following installation of the cable 100 (e.g., as mechanical stress is exerted on a buried cable, etc.).

As desired in various embodiments, a wide variety of other materials may be incorporated into the cable 100. For example, as set forth above, the cable 100 may include any number of conductors, twisted pairs, optical fibers, and/or other transmission media. In certain embodiments, one or more tubes or other structures may be situated around various transmission media and/or groups of transmission media. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials. The cable 100 illustrated in FIG. 1 is provided by way of example only. Embodiments of the disclosure contemplate a wide variety of other cables and cable constructions. These other cables may include more or less components than the cable 100 illustrated in FIG. 1. Additionally, certain components may have different dimensions and/or materials than the components illustrated in FIG. 1.

Figure 2:
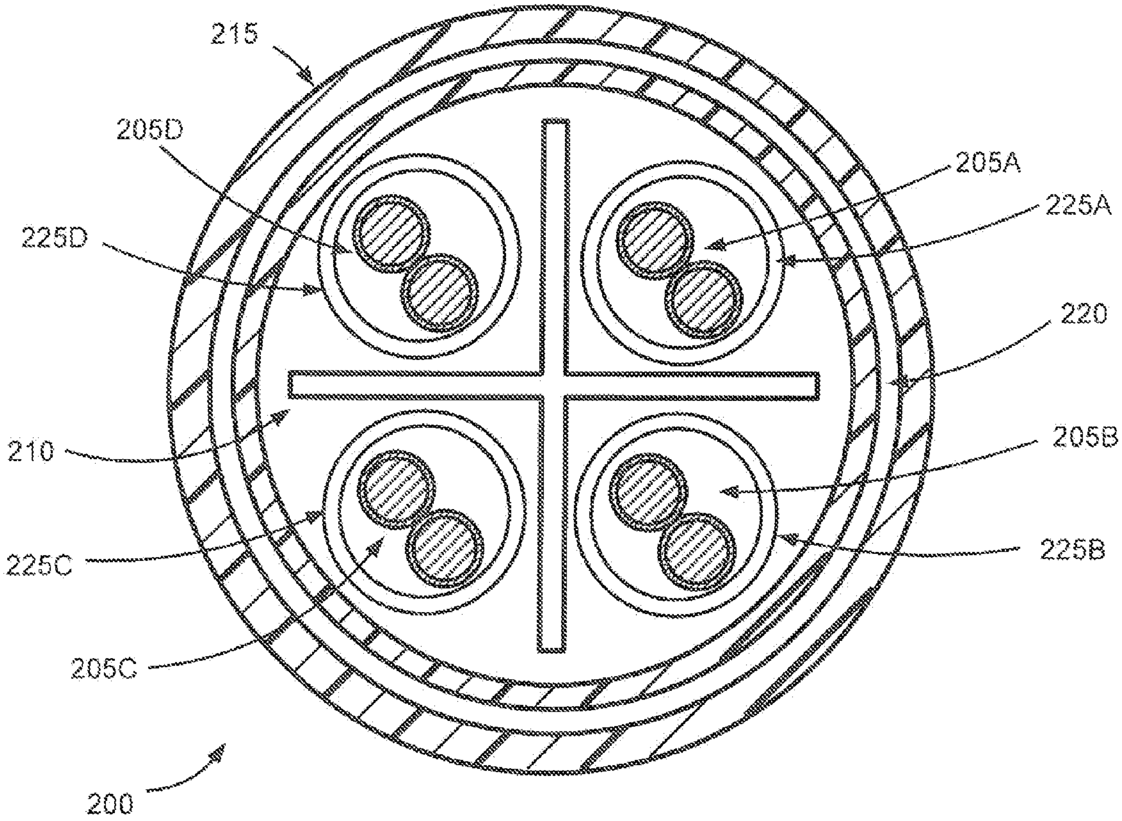
FIG. 2 is a cross-sectional view of another example cable including at least one shield, according to an illustrative embodiment of the disclosure.

FIG. 2 is a cross-sectional view of another example cable 200 including at least one shield, according to an illustrative embodiment of the disclosure. The cable 200 of FIG. 2 may include components that are similar to the cable 100 illustrated and described above with reference to FIG. 1. Accordingly, the cable 200 may include a plurality of twisted pairs 205A-D disposed in a cable core. A separator 210 may be disposed between at least two of the twisted pairs 205A-D and may function to orient and/or provide desired spacing between two or more of the twisted pairs 205A-D.

With continued reference to FIG. 2, an outer jacket 215 may enclose the internal components of the cable 200. Additionally, a shield layer 220 may be incorporated into the outer jacket 215. In certain embodiments, the shield layer 220 may be sandwiched between two other layers of outer jacket material, such as two dielectric layers. The layers of jacket material that sandwich the shield layer 220 may be formed of similar materials or, alternatively, of different materials. Further, a wide variety of suitable techniques may be utilized to bond or adhere the shield layer 220 to the other layers of the jacket 215. In other embodiments, electrically conductive material may be injected or inserted into the outer jacket 215. In yet other embodiments, the outer jacket 215 may be impregnated with electrically conductive material. In yet other embodiments, the cable 100 may not include an outer shield layer 220.

Additionally, as desired in certain embodiments, each of the twisted pairs 205A-D may be individually shielded. For example, shield layers 225A-D may respectively be wrapped or otherwise formed around each of the twisted pairs 205A-D. In other words, a first shield layer 225A may be formed around a first twisted pair 205A, a second shield layer 225B may be formed around a second twisted pair 205B, a third shield layer 225C may be formed around a third twisted pair 205C, and a fourth shield layer 225D may be formed around a fourth twisted pair 205D. In other embodiments, a portion or none of the twisted pairs may be individually shielded. Indeed, a wide variety of different shielding arrangements may be utilized in accordance with various embodiments of the disclosure.

Figure 3:
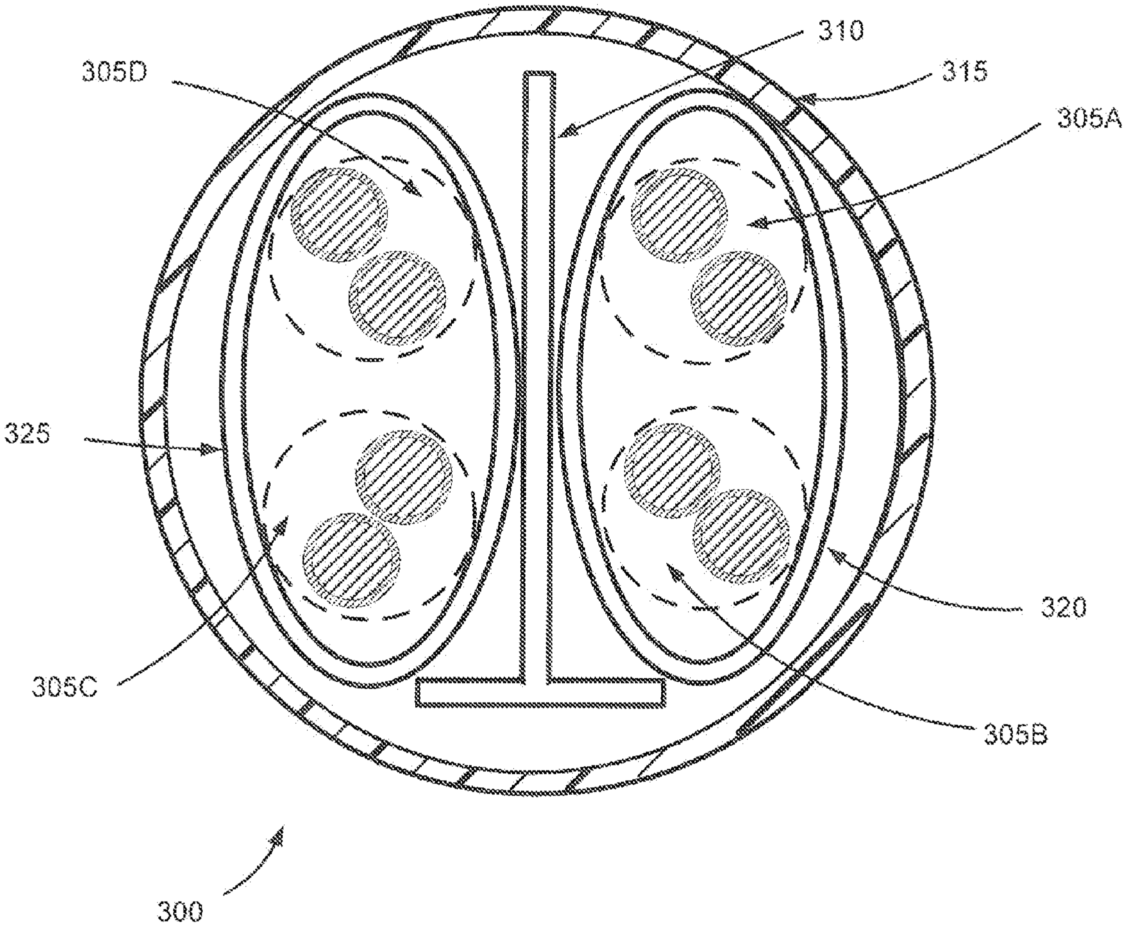
FIG. 3 is a cross-sectional view of another example cable including at least one shield, according to an illustrative embodiment of the disclosure.

FIG. 3 is a cross-sectional view of another example cable 300 including at least one shield, according to an illustrative embodiment of the disclosure. The cable 300 of FIG. 3 may include components that are similar to the cable 100 illustrated and described above with reference to FIG. 1. Accordingly, the cable 300 may include a plurality of twisted pairs 305A-D disposed in a cable core. A separator 310 may be disposed between at least two of the twisted pairs 305A-D and may function to orient and/or provide desired spacing between two or more of the twisted pairs 305A-D.

The separator 310 illustrated in FIG. 3 has a different construction than the separators 110, 210 illustrated in FIGS. 1 and 2. In particular, the separator 310 is a generally T-shaped separator that approximately bisects (or otherwise divides) the cable core and forms two channels along a longitudinal length of the cable 300 in which the twisted pairs 305A-D are disposed. For example, two twisted pairs 305A, 305B can be disposed in a first channel and the remaining two twisted pairs 305C, 305D can be disposed in a second channel. The T-shaped separator 310 illustrated in FIG. 3 is merely one example of an alternative separator shape, and a wide variety of other separator shapes may be utilized as desired.

With continued reference to FIG. 3, an outer jacket 315 may enclose the internal components of the cable 300. Additionally, any number of shield layers may be utilized to provide shielding for the twisted pairs 305A-D. For example, a first shield layer 320 may be wrapped or otherwise formed around two of the twisted pairs, such as the twisted pairs 305A, 305B disposed in the first channel. A second shield layer 325 may be wrapped or otherwise formed around other twisted pairs, such as twisted pairs 305C, 305D disposed in the second channel. In other words, shield layers may be provided for various groups of twisted pairs disposed within the cable core.

Similar to the cable 100 illustrated in FIG. 1, the cables 200, 300 illustrated in FIGS. 2 and 3 are provided by way of example only. Embodiments of the disclosure contemplate a wide variety of other cables and cable constructions. These other cables may include more or less components than the cables 200, 300 illustrated in FIGS. 2 and 3. For example, other cables may include alternative shielding arrangements and/or different types of separators or fillers. Additionally, certain components may have different dimensions and/or materials than the components illustrated in FIGS. 2 and 3.

Figure 4A:
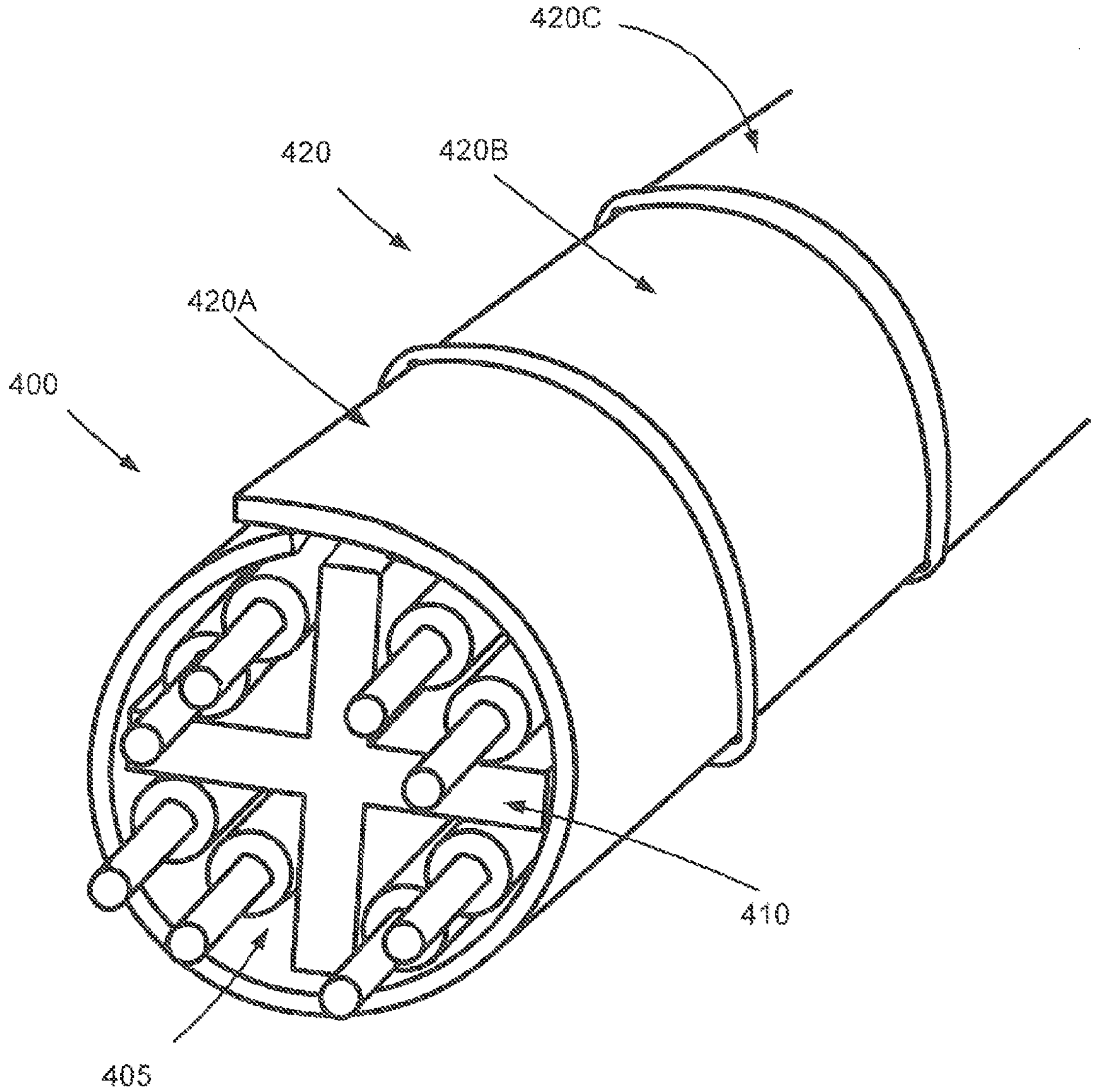
FIG. 4A illustrates a perspective view of an example cable including a segmented shield, according to an illustrative embodiment of the disclosure.

According to an aspect of the disclosure, a shield may be formed to include a plurality of longitudinally overlapping segments, and each segment may include one or more discontinuous electrically conductive patches. FIG. 4A illustrates a perspective view of an example cable 400 including a segmented shield, according to an illustrative embodiment of the disclosure. The cable 400 may include components that are similar to the cables 100, 200, 300 illustrated in FIGS. 1-3. Additionally, FIG. 4A illustrates an example cable 400 in which an overall shield encloses a plurality of transmission media (e.g., twisted pairs, etc.); however, in other embodiments, shields may be formed to enclose individual transmission media and/or any desired grouping of transmission media.

With reference to FIG. 4A, the cable 400 may include any number of transmission media situated within a cable core. As illustrated, the cable 400 may include four twisted pairs 405, although other transmission media or combinations of transmission media may be utilized.

As desired in certain embodiments, a separator 410 or filler may be positioned between two or more of the twisted pairs 405. Additionally, one or more shields may be incorporated into the cable 400. As shown in FIG. 4A, an overall shield 420 may be formed around the four twisted pairs 405. In other embodiments, a twisted pair may be individually shielded and/or desired subgroups of twisted pairs may be shielded.

According to an aspect of the disclosure, the shield 420 may be formed from a plurality of longitudinally extending segments, such as segments 420A, 420B. 420C. Each segment 420A, 420B, 420C may include one or more patches of electrically conductive material, such as metallic patches formed on a suitable carrier or substrate layer. Further, an overlap may be formed between each adjacent shield segment 420A, 420B, 420C. For example, a first shield segment 420A may be formed around the twisted pairs 405, and the first shield segment 420A may include a first end and a second end along a longitudinal direction of the cable 400. A second shield segment 420B may be formed around the twisted pairs 405, and the second shield segment 420B may also include a first end and a second end. The first end of the second shield segment 420B may overlap the second end of the first shield segment 420A. As desired, a third shield segment 420C may also be formed around the twisted pairs 405, and a first end of the third shield segment 420C may overlap the second end of the second shield segment 420B. Any number of other shield segments may be formed in a similar manner.

Other segment overlapping configurations may be utilized as desired in various embodiments. For example, both the first segment 420A and the third segment 420C may overlap the second segment 420B. Indeed, a wide variety of overlapping configurations is possible and will be appreciated by those of ordinary skill in the art.

In certain embodiments, individual shield segments 420A-C may be separately wrapped around the twisted pairs 405 such that adjacent shield segments overlap one another. In other words, individual shield segments may be incorporated into a cable during cable construction. In other embodiments, a shield 420 may be formed from a plurality of overlapping segments 420A-C, and the formed shield 420 may be wrapped around the twisted pairs 405. For example, individual segments may be combined in an overlapping fashion, and the resulting shield may then be incorporated into a cable during cable construction.

The cable 400 illustrated in FIG. 4A may include a wide variety of other components as desired in various embodiments. For example, the cable 400 may include an outside jacket that is formed over the shield 420. As another example, the cable 400 may include any combination of the example components described above with reference to FIGS. 1-3.

Figure 4B:
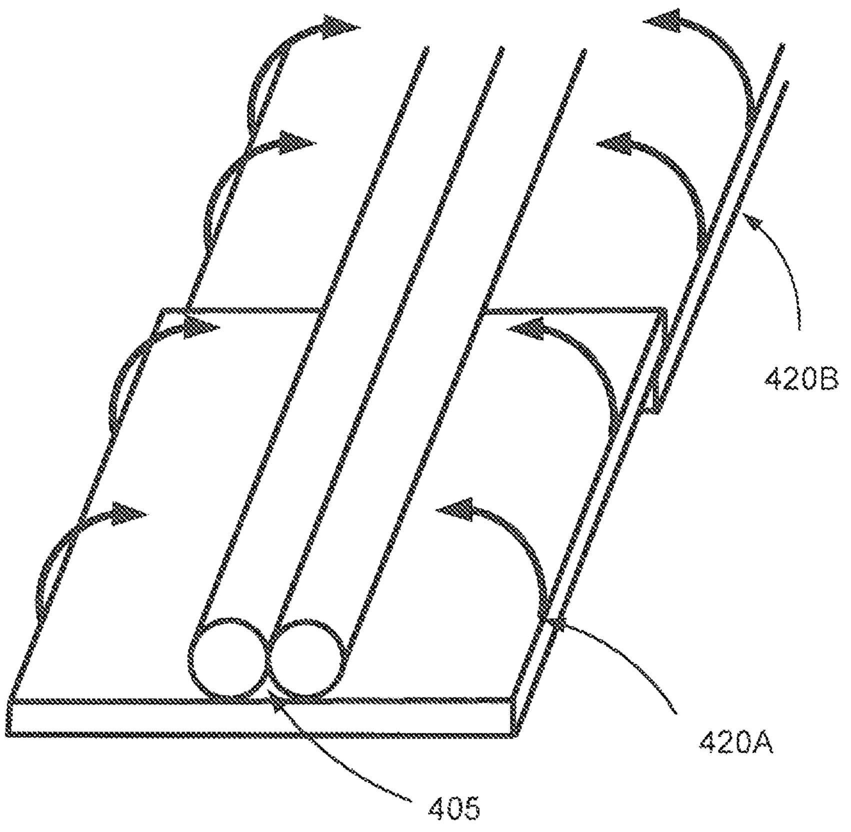
FIG. 4B illustrates an example technique for wrapping one or more twisted pairs with a shield layer in accordance with certain embodiments of the disclosure.

A wide variety of suitable techniques may be utilized as desired to wrap one or more twisted pairs with a shield layer. FIG. 4B illustrates one example technique for wrapping one or more twisted pairs 405, which may be similar to the twisted pairs 105 illustrated in FIG. 1, with a shield layer 420, which may be similar to the shield 120 illustrated in FIG. 1. With reference to FIG. 4B, in certain embodiments, one or more twisted pairs 405 may be positioned adjacent to a shield layer 420 (e.g., a shield layer formed from a plurality of overlapping segments). In other embodiments, one or more twisted pairs 405 may be positioned adjacent to one or more shield layer segments, such as segments 420A and 420B. The twisted pair(s) 405 may extend essentially parallel with the major or longitudinal axis/dimension of the shield layer 420 or the segment(s). Thus, the twisted pair(s) 405 can be viewed as being parallel to the surface or plane of the shield layer 420 of segment(s). As desired, the twisted pair(s) 405 may be approximately centered along a width dimension of the shield layer 220 or segment(s). Alternatively, the twisted pair(s) 405 may be positioned closer to one edge of the shield layer 420 or segment(s).

In certain applications, two conductors, which are typically individually insulated, will be twisted together to form a twisted pair 405. The shield layer 420 and/or various individual segments may then be wrapped around the twisted pair. Alternatively, the shield layer 420 and/or various segments may be wrapped around multiple twisted pairs of conductors, such as twisted pairs that have been twisted, bunched, or cabled together. For example, during wrapping, one edge (or both edges) of the shield layer 420 (e.g., the distal edge opposite the edge at which the twisted pair(s) 405 is positioned) may be brought up over the twisted pair(s) 405, thereby encasing the twisted pair(s) 405 or wrapping the shield layer 420 around or over the twisted pair(s) 405. In an example embodiment, the motion can be characterized as folding or curling the shield layer over the twisted pair(s) 405.

In embodiments in which individual shield segments are wrapped around the twisted pair(s) 405, the individual segments may be wrapped so as to overlap one another. For example, a first shield segment 420A may be wrapped around the twisted pair(s) 205. A second shield segment 420B may then be wrapped around the twisted pairs 205, and the second shield segment 420B may overlap the first shield segment 420A at one end or edge. As desired, a third shield segment 420C may also be wrapped around the twisted pair(s) 405, and the third shield segment 420C may overlap the second shield segment 220B. Any number of other shield segments may be wrapped around the twisted pair(s) 405 in a similar manner.

In certain embodiments, the shield layer 420 (or individual shield layer segments) may be wrapped around the twisted pair(s) 405 without substantially spiraling the shield layer 420 around or about the twisted pair(s) 405. Alternatively, the shield layer 420 (or individual shield layer segments) may be wrapped so as to spiral around the twisted pair(s) 405. Additionally, in certain embodiments, the conductive patches included in the shield layer 420 may face away from the twisted pair(s) 405, towards the exterior of a cable. In other embodiments, the conductive patches may face inward, towards the twisted pair(s) 405. In yet other embodiments, conductive patches may be formed on both sides of the shield layer 420.

In one example embodiment, a shield layer 420 and the twisted pair(s) 205 are continuously fed from reels, bins, containers, or other bulk storage facilities into a narrowing chute or a funnel that curls the shield layer over the twisted pair(s). In certain embodiments, a relatively continuous shield layer 420 (e.g., a shield layer that has been pre-formed to include overlapping segments) may be incorporated into a cable. In other embodiments, a shield layer material (e.g., a tape, etc.) may be cut as it is incorporated (or prior to incorporation) into a cable so as to facilitate the formation of overlapping segments. In yet other embodiments, multiple sources of shield layer material may be provided. Downstream from the mechanism(s) (or as a component of this mechanism) that feed cable core components, a nozzle or outlet port can extrude a polymeric jacket, skin, casing, or sheath over the shield layer 420, thus providing the basic architecture depicted in FIGS. 1-3 and discussed above.

According to an aspect of the disclosure, one or more of the electrically conductive patches included in a shield, such as shield 120, may be shorted in a circumferential direction or along a periphery of the enclosed cable components. In other words, an electrically conductive patch may contact itself at the edges of a shield (or at any other desired point(s)) once the shield is wrapped around one or more twisted pairs (and/or other cable components). A wide variety of suitable methods or techniques may be utilized to electrically short patches in a circumferential direction. FIGS. 5A-5D illustrate a few example techniques for creating electrically shorted patches within a shield, according to illustrative embodiments of the disclosure.

Figure 5A:
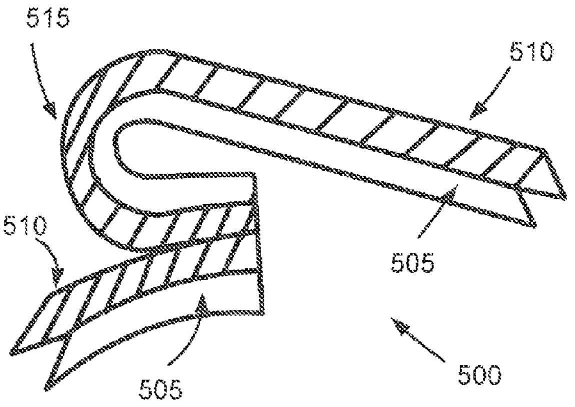
FIGS. 5A-5D illustrate example techniques for creating electrically shorted patches within a shield, according to illustrative embodiments of the disclosure.

With reference to FIG. 5A, a first example shield 500 and associated overlap portion (i.e., portion at which the shield 500 overlaps itself when wrapped around one or more cable components) is illustrated. The illustrated shield 500 may include a dielectric material 505, and one or more electrically conductive patches 510 may be formed on the dielectric material 505. A fold 515 may be formed at or near one edge of the shield 500. In other words, the shield 500 may be folded over itself along one edge (e.g., an edge in the width direction) or along one or more portions of one edge (e.g., portions of an edge corresponding to electrically conductive patches). Accordingly, when the shield 500 is wrapped around one or more twisted pairs (and/or other cable components) and brought into contact with itself within an overlapping region, the patch material at one edge of the shield 500 will be brought into contact with the patch material at or near the opposing edge of the shield 500.

Figure 5B:
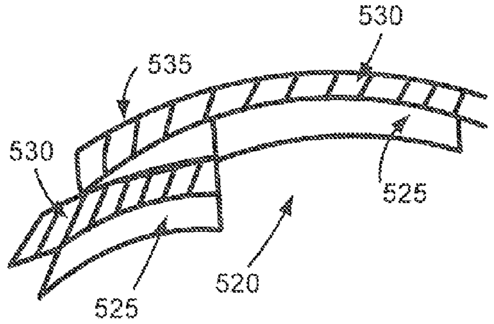

FIG. 5B illustrates another example shield 520 and associated overlap portion. The shield 520 may include a dielectric material 525, and one or more electrically conductive patches 530 may be formed on the dielectric material 525. Along one edge of the shield 520, an overhanging portion 530 may be formed in which electrically conductive patch material extends beyond the dielectric material 525. A wide variety of suitable techniques may be utilized as desired to form the overhanging portion 530. For example, the dielectric material 525 may be removed from one edge (or a portion of one edge) of the shield 520. As another example, one or more electrically conductive patches 530 may be formed on or attached to the dielectric material 525 so as to overhang or extend beyond one edge (or one or more portions of one edge) of the dielectric material 525. Accordingly, when the shield 520 is wrapped around one or more twisted pairs (and/or other cable components) and brought into contact with itself, the two edges (or a first edge and another portion) of an electrically conductive patch 530 will be brought into contact with one another, thereby creating an electrically shorted patch.

Figure 5C:
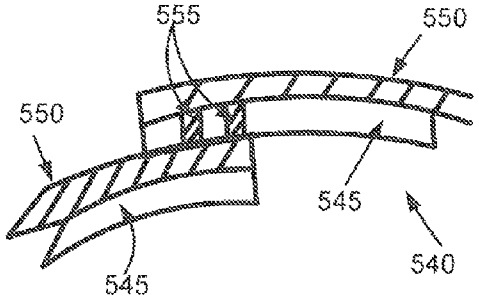

FIG. 5C illustrates another example shield 540 and associated overlap portion in which electrically shorted patches may be formed. The shield 540 may include a dielectric material 545, and one or more electrically conductive patches 550 may be formed on the dielectric material 545. Along one edge of the shield 540 (or at any other desired areas within the overlap portion), one or more vias 555 (e.g., metallic or electrically conductive vias, etc.) may be provided in the dielectric material 545 to permit two portions of a patch 550 to be brought into contact. Although not illustrated, in other embodiments, one or more gaps or holes may be formed in the dielectric material 545. Thus, when wrapped around one or more twisted pairs (and/or other cable components), one edge of an electrically conductive patch may be permitted to contact another edge of the patch via the one or more gaps or holes.

Figure 5D:
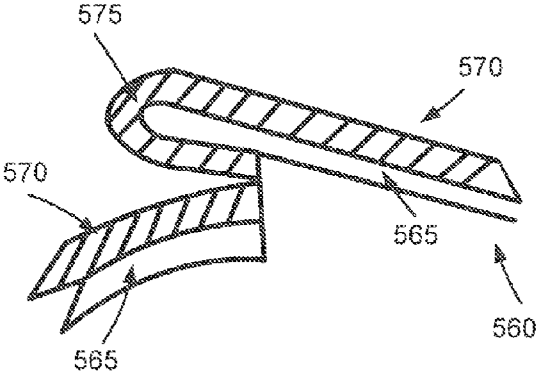

FIG. 5D illustrates another example shield 560 and associated overlap portion in which electrically shorted patches may be formed. The shield 560 may include a dielectric material 565, and one or more electrically conductive patches 570 may be formed on the dielectric material 565. A patch 570 may include an overlapping or double-sided portion 575 at one edge (or at one or more portions of one edge) of the shield 560. For example, the patch 570 may be folded over one edge of the dielectric material 565. As another example, the patch 570 may be formed on both sides of the dielectric material 565 along one edge (or at one or more portions of one edge) of the shield 560. In other words, at one edge of the shield 560, an electrically conductive patch 570 may be present on both sides of the dielectric material 565. Accordingly, when the shield 560 is wrapped around one or more twisted pairs (and/or other cable components) and brought into contact with itself, the patch 570 will be electrically shorted.

A wide variety of other suitable methods and/or techniques may be utilized as desired to form shield layers including discontinuous patches that are electrically shorted in the circumferential direction. For example, in certain embodiments, one or more discontinuous patches may be formed along a length of the cable without a carrier tape or other substrate. For example, during formation of a cable, a plurality of discontinuous patches may be wrapped or otherwise formed around one or more twisted pairs or other transmission media. Any number of suitable techniques may be utilized as desired to hold the patches in place. For example, an adhesive (e.g., a contact adhesive, a pressure sensitive adhesive, a hot melt adhesive) may be applied to a patch in order to adhere the patch to the transmission media, an inner surface of an outside cable jacket, and/or to any other desired components of a cable (e.g., an armor layer, a water-blocking layer, a tube, etc.).

Figure 6A:
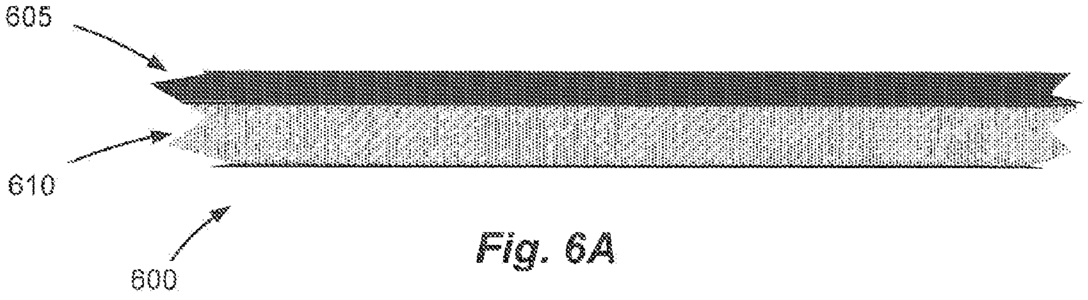
FIGS. 6A-6B illustrate cross-sections for example shields that may be utilized to in accordance with various embodiments of the disclosure.
Figure 6B:
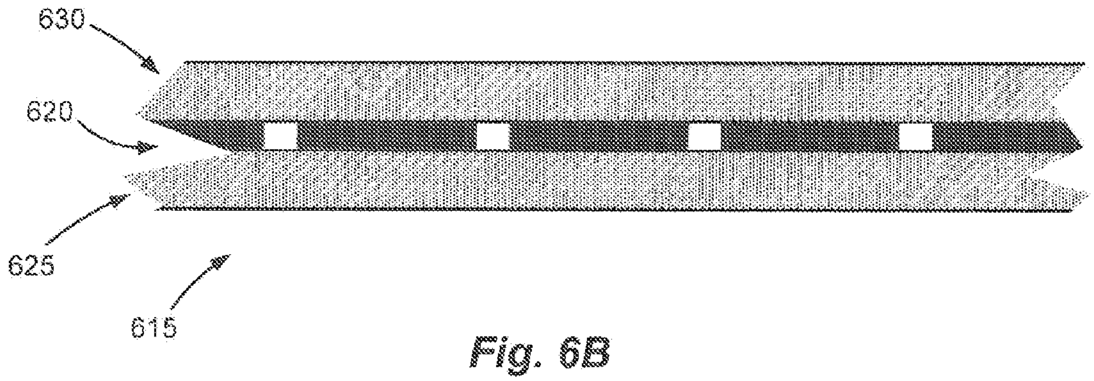

FIGS. 6A-6B illustrate cross-sections for example shield segments that may be utilized to form shields in accordance with various embodiments of the disclosure, such as the shield 120 illustrated in FIG. 1. FIG. 6A illustrates a first example shield segment 600 that may be utilized in an overlapping shield. In certain embodiments, the shield segment 600 may be formed as a tape or other configuration including a substrate or carrier layer with electrically conductive material formed on the substrate. The segment 600 may include a dielectric layer 610, and an electrically conductive layer 605 may be formed or disposed on one side of the dielectric layer 610. As shown, the electrically conductive layer 605 may cover substantially all of one side of the dielectric layer 610. However, in other embodiments, the electrically conductive layer 605 may include any number of patches of electrically conductive material formed on the dielectric layer 610. As desired, additional patches of electrically conductive material may be formed on an opposite side of the dielectric layer 610 to cover gaps between adjacent patches.

FIG. 6B illustrates another example shield 615 in which an electrically conductive layer 620 is sandwiched between two dielectric layers 625, 630. A wide variety of other constructions may be utilized as desired to form a shield segment in accordance with various embodiments of the disclosure. Indeed, any number of dielectric and electrically conductive layers may be utilized. The shield segments 600, 615 illustrated in FIGS. 6A-6B are provided by way of example only.

Figure 7A:
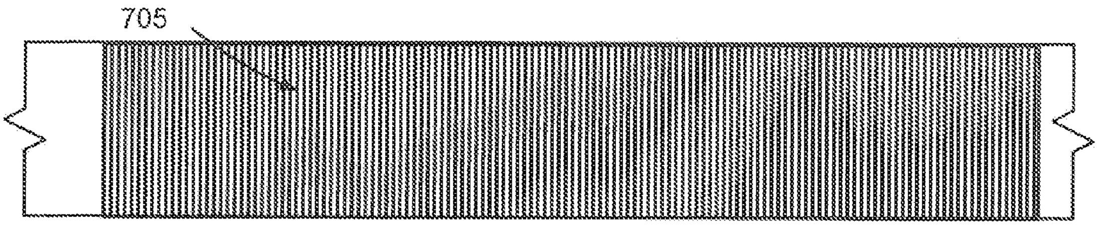
FIGS. 7A-7D illustrate example electrically conductive patch configurations that may be utilized to form shields in accordance with various embodiments of the disclosure.

FIGS. 7A-7D illustrate example electrically conductive patch configurations that may be utilized to form a shield segment in accordance with various embodiments of the disclosure, such as one or more shield segments incorporated into the shield 120 illustrated in FIG. 1. With reference to FIG. 7A, a top level (or bottom level) view of a first example shield segment 700 is illustrated. The shield segment 700 may include a relatively continuous electrically conductive patch 705 formed on a dielectric material. The patch 705 may cover all or substantially all of one side of the dielectric material. As a result, the shield segment 700 may be incorporated into an overlapping discontinuous shield. Additionally, in certain embodiments, when the shield segment 700 is wrapped around one or more transmission media, the patch 705 may be circumferentially shorted utilizing any number of the techniques described herein.

Figure 7B:
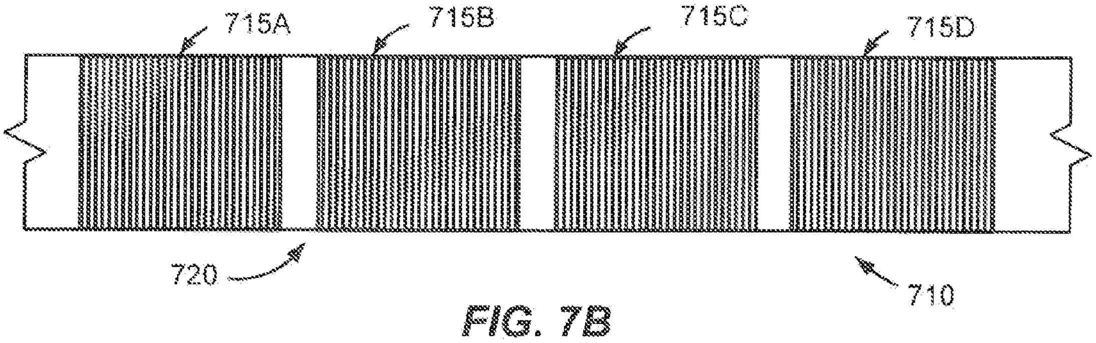

With reference to FIG. 7B, a top level (or bottom level) view of a second example shield segment 710 is illustrated. The shield segment 710 may include any number of rectangular patches of electrically conductive material, such as patches 715A-D, formed on a dielectric material. As desired in various embodiments, the patches 715A-D may include any desired lengths (e.g., approximately 2 meters, etc.), and any desired gap 720 or separation distance may be provided between adjacent patches. In certain embodiments, the patches may be formed in accordance with a repeating pattern having a definite step or period. As desired, additional patches may be formed on an opposing side of the dielectric material to cover the gaps 720. Additionally, in certain embodiments, each patch 715A-D may have a width that extends from one edge of the shield segment 710 to an opposing edge of the shield segment 710. Thus, in certain embodiments, when the shield segment 710 is wrapped around one or more transmission media, the patches 715A-D may be circumferentially shorted utilizing any number of the techniques described herein.

Figure 7C:
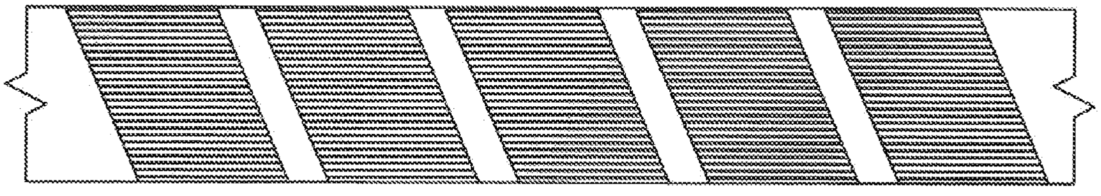

FIG. 7C illustrates a top level (or bottom level) view of a third example shield segment 730. The shield segment 730 may include any number of electrically conductive patches having the shape of a parallelogram. In other words, the patches may be formed at an angle along the shield segment. As shown, the patches may be formed at an acute angle with respect to the width dimension of the tape. In certain embodiments, the acute angle facilitates manufacturing and enhances patch-to-substrate adhesion.

Additionally, the acute angle may also facilitate the covering of opposing isolating spaces or gaps. For example, the acute angle results in the isolating spaces being oriented at a non-perpendicular angle with respect to the pairs and the longitudinal axis of the cable. If any manufacturing issue results in part of the isolating spaces not being completely covered (e.g., by a conductive patch on an opposite tape side), such an open area will likewise be oriented at a non-perpendicular angle with respect to the pairs. Such an opening will therefore spiral about the pairs, rather than circumscribing a single longitudinal location of the cable. Such a spiraling opening is believed to have a lesser impact on shielding than would an opening circumscribing a single longitudinal location. In other words, an inadvertent opening that spirals would allow less unwanted transmission of electromagnetic interference than a non-spiraling opening. In certain embodiments, benefit is achieved when the acute angle is about 45 degrees or less. In other embodiments, benefit is achieved when the acute angle is about 35 degrees or less, about 30 degrees or less, about 25 degrees or less, about 20 degrees or less, or about 15 degrees or less. In other embodiments, benefit is achieved when the acute angle is between about 12 and 40 degrees. In certain embodiments, the acute angle may be in a range between any two of the degree values provided in this paragraph.

Figure 7D:
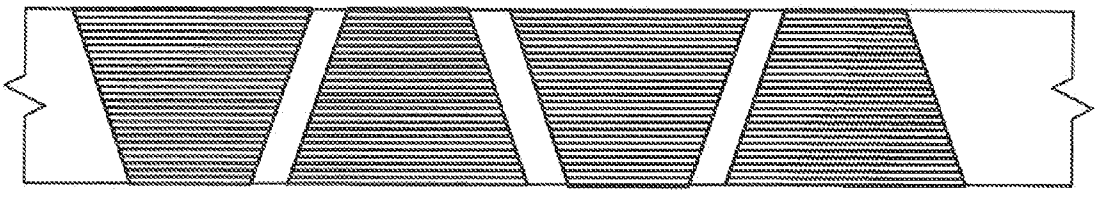

FIG. 7D illustrates a top level (or bottom level) view of a fourth example shield segment 740. The shield segment 740 may include any number of electrically conductive patches having a trapezoidal shape. In certain embodiments, the orientation of adjacent trapezoidal patches may alternate. Similar to the patch pattern illustrated in FIG. 7C, the trapezoidal patches may provide manufacturing and/or shielding benefits. A wide variety of other suitable patch configurations may be utilized as desired in various embodiments.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A cable comprising:

at least one twisted pair of individually insulated conductors;

a shield formed around the at least one twisted pair, the shield comprising:

a plurality of segments positioned along a longitudinal direction of the cable, each segment comprising a respective dielectric substrate with electrically conductive material formed on the substrate, and each segment electrically isolated from the other segments, wherein a respective overlap is formed between adjacent segments along a shared longitudinal edge, and wherein, for each pair of overlapping adjacent segments, the dielectric substrate of an overlapping segment is positioned between the respective electrically conductive material of the two adjacent segments; and a jacket formed around the at least one twisted pair and the shield.

2. The cable of claim 1, wherein a first segment included in the plurality of segments overlaps a second segment included in the plurality of segments by approximately one half inch or greater.

3. The cable of claim 1, wherein a first segment included in the plurality of segments overlaps a second segment included in the plurality of segments by approximately one inch or greater.

4. The cable of claim 1, wherein the plurality of segments comprises a first segment, a second segment, and a third segment, each segment comprising a respective first end and a respective second end opposite the first end along the longitudinal direction, wherein the first end of the second segment overlaps the second end of the first segment, and wherein the first end of the third segment overlaps the second end of the second segment.

5. The cable of claim 1, wherein the electrically conductive material covers substantially an entire surface of the dielectric substrate of at least one of the plurality of segments.

6. The cable of claim 1, wherein electrically conductive material on at least one of the plurality of segments is electrically shorted to itself in a circumferential direction.

7. The cable of claim 6, wherein the at least one segment extends in the longitudinal direction of the cable and further comprises a first edge and a second edge along a width dimension, and wherein either (i) the segment is folded over itself at one or more points along the second edge, (ii) the electrically conductive material extends beyond the dielectric substrate at one or more points along the second edge, (iii) the electrically conductive material is formed on opposing sides of the dielectric substrate at one or more points along the second edge, (iv) one or more openings are formed in the dielectric substrate at or near the second edge, or (v) one or more electrically conductive vias are formed through the dielectric substrate at or near the second edge.

8. The cable of claim 1, wherein each of the plurality of segments has a length of approximately two meters or greater.

9. The cable of claim 1, wherein the electrically conductive material for each segment has a length of approximately two meters or greater.

10. The cable of claim 1, wherein the at least one twisted pair comprises a plurality of twisted pairs.

11. A cable comprising:

at least one electrical conductor;

a shield having an overall length in a longitudinal direction, the shield consisting of a plurality of individual segments formed around the at least one conductor and positioned adjacent to one another along a longitudinal length of the cable, each segment having a respective length in the longitudinal direction that is less than the overall length and comprising electrically conductive material formed on a respective dielectric substrate, wherein a respective overlap is formed between each pair of adjacent segments and, for at least one pair of segments, the dielectric substrate of an overlapping segment is positioned between the respective electrically conductive material of the pair of segments; and a jacket formed around the at least one twisted pair and the shield.

12. The cable of claim 11, wherein a first segment included in the plurality of segments overlaps a second segment included in the plurality of segments by approximately one half inch or greater.

13. The cable of claim 11, wherein the electrically conductive material covers substantially an entire surface of the dielectric substrate of at least one of the plurality of segments.

14. The cable of claim 11, wherein a plurality of discrete patches of electrically conductive material are formed on the dielectric substrate of at least one of the plurality of segments.

15. The cable of claim 11, wherein electrically conductive material on at least one of the plurality of segments is electrically shorted to itself in a circumferential direction.

16. The cable of claim 15, wherein the at least one segment extends in the longitudinal direction of the cable and further comprises a first edge and a second edge along a width dimension, and wherein either (i) the segment is folded over itself at one or more points along the second edge, (ii) the electrically conductive material extends beyond the dielectric substrate at one or more points along the second edge, (iii) the electrically conductive material is formed on opposing sides of the dielectric substrate at one or more points along the second edge, (iv) one or more openings are formed in the dielectric substrate at or near the second edge, or (v) one or more electrically conductive vias are formed through the dielectric substrate at or near the second edge.

17. The cable of claim 11, wherein the respective length of each of the plurality of segments is approximately two meters or greater.

18. A cable comprising:

at least one transmission media;

a shield layer formed around the at least one transmission media, the shield layer comprising a plurality of electrically isolated segments longitudinally arranged along a length of the cable with a respective overlap formed between adjacent segments, wherein each pair of adjacent segments is in contact with one another, and wherein each segment comprises:

a dielectric substrate; and electrically conductive material formed on the dielectric substrate; and a jacket formed around the at least one transmission media and the shield layer, wherein, for each pair of overlapping adjacent segments, the dielectric substrate of an overlapping segment is positioned between the respective electrically conductive material of the two adjacent segments.

19. The cable of claim 18, wherein each segment has a length of approximately two meters or greater.

20. The cable of claim 18, wherein a first segment included in the plurality of segments overlaps a second segment included in the plurality of segments by approximately one half inch or greater.

* * * * *